United States Patent
Mostovoy et al.

(10) Patent No.: US 6,416,634 B1
(45) Date of Patent: Jul. 9, 2002

(54) METHOD AND APPARATUS FOR REDUCING TARGET ARCING DURING SPUTTER DEPOSITION

(75) Inventors: Roman Mostovoy, San Francisco; Glen T. Mori, Pacifica, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/543,770

(22) Filed: Apr. 5, 2000

(51) Int. Cl.[7] ............................................. C23C 14/34
(52) U.S. Cl. ..................... 204/192.12; 204/298.07; 204/298.11; 204/298.12
(58) Field of Search ................ 204/298.07, 298.11, 204/298.12, 192.12; 118/715, 719; 156/345

(56) References Cited

U.S. PATENT DOCUMENTS

| | | | |
|---|---|---|---|
| 3,630,881 A | * 12/1971 | Lester et al. | 204/298.12 |
| 5,520,142 A | * 5/1996 | Ikeda et al. | 118/733 |
| 5,690,795 A | * 11/1997 | Rosenstein et al. | 204/192.1 |
| 5,914,018 A | 6/1999 | Fu et al. | 204/298.12 |
| 6,149,776 A | * 11/2000 | Tang et al. | 204/192.12 |

* cited by examiner

Primary Examiner—Rodney G. McDonald
(74) Attorney, Agent, or Firm—Dugan & Dugan (57) ABSTRACT

A sealing surface of a sputter deposition chamber is provided with a groove adapted to receive a sealing member. The groove comprises an inner wall having a plurality of restrictive openings configured to restrict the flow of gas from the groove through the plurality of restrictive openings so as to reduce target arcing during a plasma process within the sputter deposition chamber. A method also is provided for reducing defect formation during plasma processing. The method comprises providing a sputter deposition chamber having at least one sealing surface; and restricting the flow of gas from the at least one sealing surface into the sputter deposition chamber so as to reduce target arcing during sputter deposition within the sputter deposition chamber.

24 Claims, 7 Drawing Sheets

METHOD AND APPARATUS FOR REDUCING TARGET ARCING DURING SPUTTER DEPOSITION

FIELD OF THE INVENTION

The present invention relates generally to film deposition and more particularly to a method and apparatus for reducing target arcing during metal film deposition.

BACKGROUND OF THE INVENTION

Metal films are used widely within semiconductor integrated circuits to make contact to and between semiconductor devices (i.e., metal interconnects). Because of the high densities required for modern integrated circuits, the lateral dimensions of interconnects, as well as the lateral dimensions between interconnects, have shrunk to such a level that a single defect can destroy an entire wafer die by shorting a junction region or open-circuiting a gate electrode of an essential semiconductor device. Defect reduction within interconnect metal films, therefore, is an ever-present goal of the semiconductor industry that increases in importance with each generation of higher density integrated circuits.

Interconnect metal films typically are deposited via physical vapor deposition within a plasma chamber, and more recently via high density plasma (HDP) deposition. In both processes, a target of to-be-deposited material (e.g., the metal comprising the interconnect) is sputtered through energetic ion bombardment that dislodges atoms from the target. The dislodged atoms travel to a wafer disposed below the target and form a metal film thereon. Thereafter the metal film is patterned to form the interconnect.

Ideally the metal film is highly uniform and defect free. However, a substantial number of blobs or splats of target material appear within thin films formed by sputter deposition within conventional sputtering chambers. These splats are believed to result when a phenomenon known as target arcing occurs (e.g., due to arc-induced localized heating of the target that melts and liberates a portion of the target material as described below).

Accordingly, a need exists for a sputtering target and/or sputtering chamber that reduce target arcing.

SUMMARY OF THE INVENTION

The present inventors have discovered that the flow of concentrated gas from sputter deposition chamber sealing surfaces can result in target arcing, and defect (e.g., splat) formation that accompanies such target arcing. Specifically, conventional sputter deposition chambers typically employ sealing surfaces having grooves with sealing members (e.g., o-rings) disposed therein to form a vacuum seal. For example, a sealing surface having a groove and a sealing member disposed therein may be employed to form a vacuum seal between a sputtering target assembly and the sidewalls of a vacuum chamber when the sputtering target assembly serves as a chamber "lid". Because gas may become trapped within the groove of such a sealing surface (and negatively affect the vacuum seal of the sealing surface), relatively large "vent slots" often are provided to the sealing surface that vent the trapped gas from the sealing surface into the vacuum chamber.

The present inventors have found that conventional vent slots significantly concentrate the flow of trapped gas from sealing surface grooves into a vacuum chamber. This concentrated, trapped gas creates a high gas partial pressure along a few paths within the vacuum chamber and can lead to target arcing as described below. Defect formation that accompanies such target arcing thereby is increased.

To reduce target arcing due to the venting of trapped gas from sealing surfaces, the present invention preferably restricts the flow rate of trapped gas from sealing surfaces and/or increases the number of paths available for removing trapped gas from sealing surfaces.

Trapped gas concentration with a vacuum chamber thereby is decreased, and the likelihood of target arcing (and defect formation associated therewith) is decreased.

In a first aspect of the invention, a sealing surface of a sputter deposition chamber is provided with a groove adapted to receive a sealing member. The groove comprises an inner wall (i.e., a wall closest to the interior of the sputter deposition chamber) having a plurality of restrictive openings configured to restrict the flow of gas from the groove through the plurality of restrictive openings so as to reduce target arcing during a plasma process within the sputter deposition chamber.

In a second aspect of the invention, a method is provided for reducing defect formation during plasma processing. The method comprises providing a sputter deposition chamber having at least one sealing surface; and restricting the flow of gas from the at least one sealing surface into the sputter deposition chamber so as to reduce target arcing during sputter deposition within the sputter deposition chamber.

Other objects, features and advantages of the present invention, as well as the structure of various embodiments of the invention, will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numerals indicate identical or functionally similar elements.

DETAILED DESCRIPTION OF THE PREFERRED EMBODIMENTS

In order to understand the significance of the present invention, it is necessary to understand target arc-induced defect generation within a plasma sputter deposition chamber. Accordingly, FIG. 1 is a schematic diagram of a conventional magnetron sputtering system 101 employing a sputtering target assembly 103.

Figure 1:
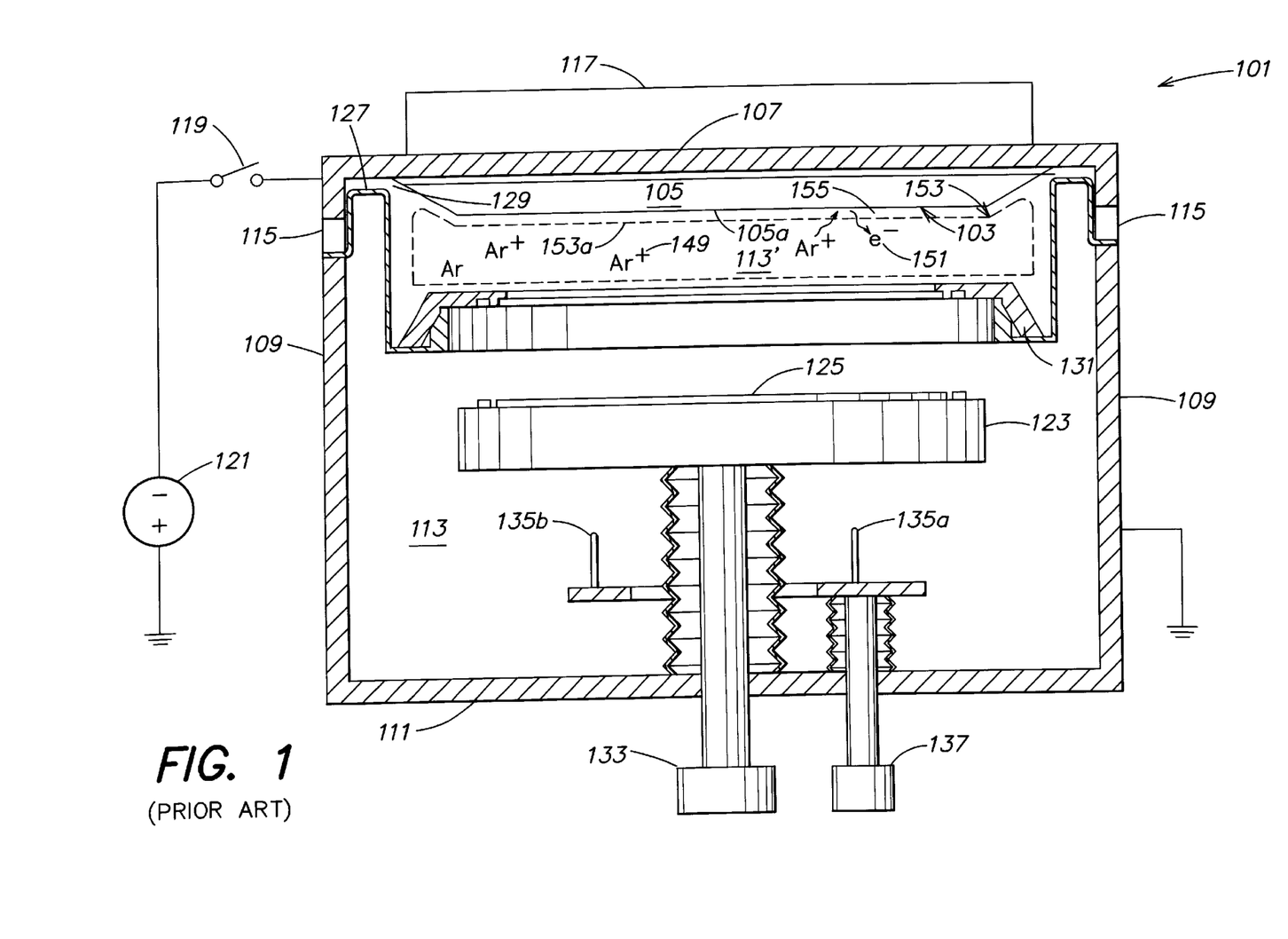
FIG. 1 is a schematic diagram of a conventional magnetron sputtering system.

With reference to FIG. 1, the sputtering target assembly 103 comprises a target material 105 mounted to a target backing plate 107. The target backing plate 107 extends beyond the perimeter of the target material 105, and preferably has a lipped perimeter which extends in the direction of the target material 105 and interfaces with one or more side enclosure walls 109 so as, in conjunction with a bottom wall 111, to form a sealed processing region 113. Preferably the side enclosure walls 109 comprise a removable insulating member such as an aluminum oxide portion 115 positioned at the top thereof, so as to interface with the target backing plate 107.

The sputtering system 101 further comprises a magnet 117 positioned above the target backing plate 107, and a switch 119 for connecting the target backing plate 107 to a negative, D.C. voltage source 121. A substrate support 123 is positioned below the sputtering target assembly 103 within the sealed processing region 113. The substrate support 123 is adapted to support a semiconductor substrate 125 during processing within the sputtering system 101.

A shield 127 is mounted to the side enclosure walls 109, preferably below the removable insulating member 115. Preferably the shield 127 extends upwardly in close proximity of the target backing plate 107 to leave only a very narrow passage 129 between the shield 127 and the target backing plate 107. The narrow passage 129 provides two features; first, the passage 129, defined by the distance between the shield 127 and the target backing plate 107, is sufficiently small to maintain conditions in the passage 129 which are not conducive to the formation of a plasma in the passage 129; and second, in combination with the target assembly 103, the shield 127 provides a sinuous path so as to minimize potential particle deposition on the surface of the target backing plate 107 exposed above the periphery of the target material 105 (as such deposition may form a conductive path between the negatively biased target backing plate 107 and the side enclosure walls 109 which are typically grounded). The narrowness of the passage 129 that is required to prevent plasma formation therein can easily be determined by one of ordinary skill in the art, once the gas pressure within the processing region 113 and the voltage potential between the shield 127 and the target backing plate 107 are known. However, the passage 129 should not be so narrow as to encourage arcing between the shield 127 and the target backing plate 107 (i.e., target arcing), as target arcing can generate localized areas of melted target material which can drip therefrom so as to form a defect known as a splat on the substrate 125 position therebelow. Therefore, the preferred distance between the shield 127 and the target backing plate 107 is a few millimeters (e.g. about 1–5 mm) depending on the specific processing parameters employed.

Both the shield 127 and the substrate support 123 preferably are grounded, although they alternatively may be biased, or floating with no ground or bias.

The shield 127 also supports an edge ring 131 that shields the edge of the substrate 125 from deposition during formation of a material layer on the substrate 125 (e.g., to prevent shorting of top surface metal layers to the bulk substrate region of the substrate 125 as is known in the art). The substrate support 123 may be raised via a first lift mechanism 133 to the level of the edge ring 131 prior to material layer deposition. During substrate transfer to or from the substrate support 123, a plurality of wafer lift pins 135a–c may lower or lift the substrate 125 via a second lift mechanism 137 and/or the first lift mechanism 133 as is known in the art.

Figure 2A:
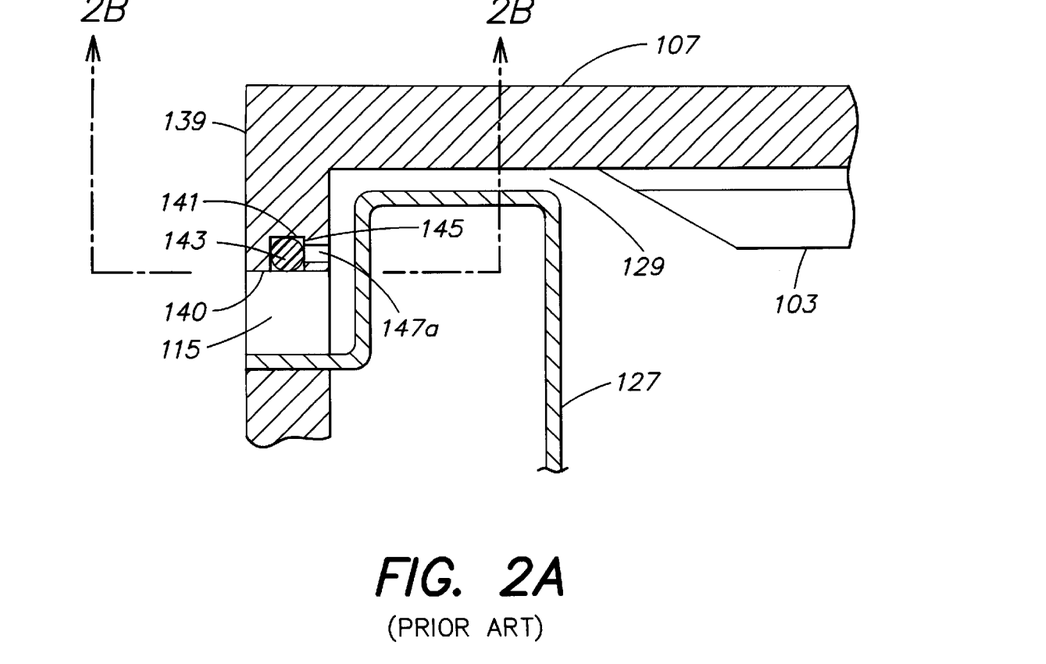
FIG. 2A is a partial side cross-sectional view of a conventional sputtering target assembly, showing the mechanism which seals the sputtering target assembly to an insulating member.
Figure 2B:
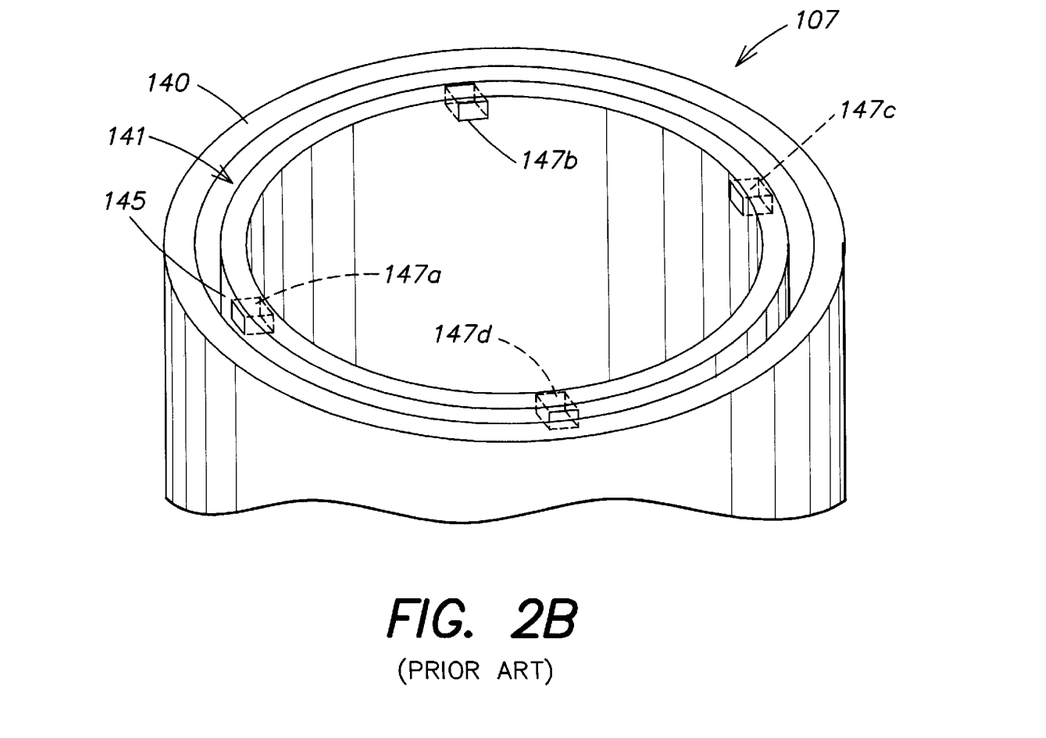
FIG. 2B is a bottom perspective view of the sealing mechanism of FIG. 2A taken along line 2B—2B of FIG. 2A.

FIG. 2A is a partial side cross-sectional view of a conventional sputtering target assembly 103, showing the mechanism which seals the sputtering target assembly 103 to the insulating member 115. As shown in FIG. 2A, the lipped perimeter 139 of the target backing plate 107 comprises a sealing surface 140, having a dovetail groove 141 formed therein. The dovetail groove 141 is adapted to receive a sealing member, such as an o-ring 143. An inner wall 145 of the groove 141 comprises four vent slots 147a–d (as shown in FIG. 2B which is a bottom perspective view of the target backing plate 107 taken along line 2B—2B in FIG. 2A) equally spaced along the inner wall 145. The vent slots 147a–d allow gas which would otherwise be trapped between the o-ring and the inner wall 145 of the groove 141 to be pumped therefrom as the processing region 113 is pumped to a vacuum pressure. This trapped gas may result from many sources including outgassing of the o-ring 143, permeation of air from the ambient environment surrounding the sputtering system 101 through the o-ring 143 toward the vacuum environment within the sputtering system 101, air trapped by the o-ring 143 during venting of the sputtering system 101 to atmospheric pressure, etc. Without the aid of the vent slots 147a–d, the trapped gas would interfere with the seating of the o-ring 143 within the groove 141; and proper seating of the o-ring 143 within the groove 141 is essential for adequate sealing between the target backing plate 107 and the insulating member 115 during vacuum processing.

In operation, the first lift mechanism 133 raises the substrate 125 to the edge ring 131 and the processing region 113 is evacuated to a pressure of about 2 to 5 milliTorr (e.g., via a vacuum pump not shown). The switch 119 is closed and a large negative voltage (e.g., about 500 volts) is placed on the target assembly 103 relative to both the shield 127 and the substrate support 123. A corresponding electric field is produced between the target assembly 103 and the shield 127, and between the target assembly 103 and the substrate support 123. An inert gas such as argon (Ar) then is introduced into the region defined by the shield 127 (i.e., shielded region 113').

Some of the argon atoms within the shielded region 113' are stripped of electrons due to the large electric field between the target assembly 103 and the substrate support 123. Positively charged argon ions (Ar+) such as argon ion 149 thereby are formed. These positively charged argon ions accelerate toward and collide with the surface 105a of the negatively charged target material 105.

As a result of these collisions, electrons such as electron (e–) 151, are emitted from the target material 105. Each electron accelerates toward the substrate support 123 due to the electric field generated between the target assembly 103 and the substrate support 123, and due to magnetic fields generated by the magnet 117, travels in a spiral trajectory. The spiraling electrons eventually strike argon atoms within the shielded region 113' so as to generate additional positively charged argon ions that accelerate toward and strike the target material 105. Additional electrons thereby are admitted from the target material 105, which generate additional positively charged argon ions, which generate additional electrons, etc. This feedback process continues until a steady-state plasma 153 is produced within the shielded region 113'.

As the plasma 153 reaches steady state, an area essentially free of charged particles (i.e., a dark space 155), forms between the surface 105a of the target material 105 and a top boundary 153a of the plasma 153. A large voltage differential exists between the surface 105a and the top boundary 153a and individual electrons emitted from the target material 105 are believed to tunnel (e.g., in a wave form rather than in a particle form) through the dark space 155 so as to maintain this large voltage differential. As described further below, occasionally the dark space 155 is breached and a large flux of charged particles (similar to a flow of current) travels through the dark space 155 (i.e., an arc is produced).

In addition to electrons, due to momentum transfer between the argon ions and the target material 105, target atoms are ejected or "sputtered" from the target material 105. The sputtered target atoms travel to and condense on the semiconductor substrate 125 forming a thin film of target material thereon. Ideally, this thin film is highly uniform and defect free. However, a substantial number of blobs or splats of target material (i.e., splat defects or splats) may appear within thin films formed by sputter deposition within a sputtering system that employs a conventional target backing plate having vent slots such as the vent slots 147a–d of the target backing plate 107 of FIGS. 2A and 2B.

These splat defects are believed to result from arc-induced localized heating of the target material 105 that melts and liberates a portion of the target material. The liberated target material travels to the substrate 125, splatters thereon, cools and reforms, due to surface tension, as a splat defect in the deposited thin film. Splats are very large (e.g., 500 µm) in relation to typical metal line widths (e.g., less than 1 µm) and affect device yield by shorting metal lines. It is believed that up to 50% of the in-film defects produced in current interconnect metallization schemes are induced, splat-type defects.

The present inventors have discovered that conventional vent slots such as the vent slots 147a–d contribute to splat formation by initiating target arcing. Specifically, it has been found that the use of only a few (e.g., four), relatively narrow vent slots (such as the vent slots 147a–d) leads to a concentrated flow of trapped gas from the o-ring 143 to the processing region 113 at each vent slot location. The concentrated trapped gas flow (e.g., along four paths if the four vent slots 147a–d are employed) produces a high trapped gas partial pressure along each path. Because of the high voltage present across the dark space 155, the high trapped gas partial pressure within each vent slot increases the possibility for arcing to occur between the target surface 105a and the top boundary 153a of the plasma 153 when the trapped gas exits the vent slots and enters the processing region 113. For example, the trapped gas may leave the vent slots with sufficient pressure to enter the dark space 155 with a density that leads to electrical breakdown of the trapped gas atoms. The likelihood of splat formation thereby is increased.

Figure 3A:
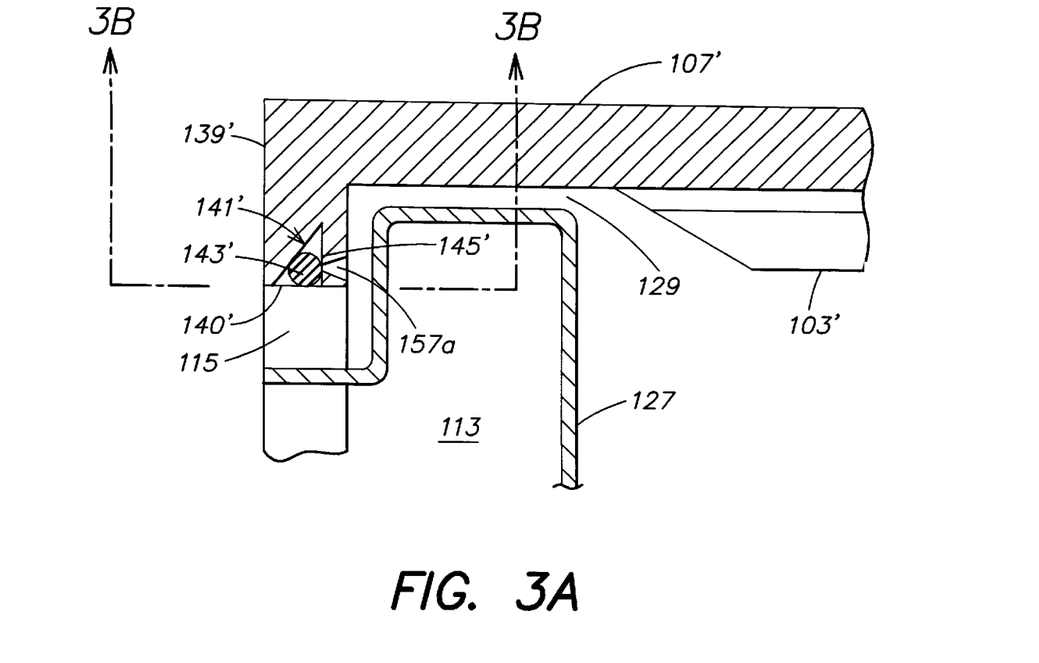
FIG. 3A is a partial side cross-sectional view of an inventive sputtering target assembly employing a lipped inventive target backing plate configured in accordance with the present invention.
Figure 3B:
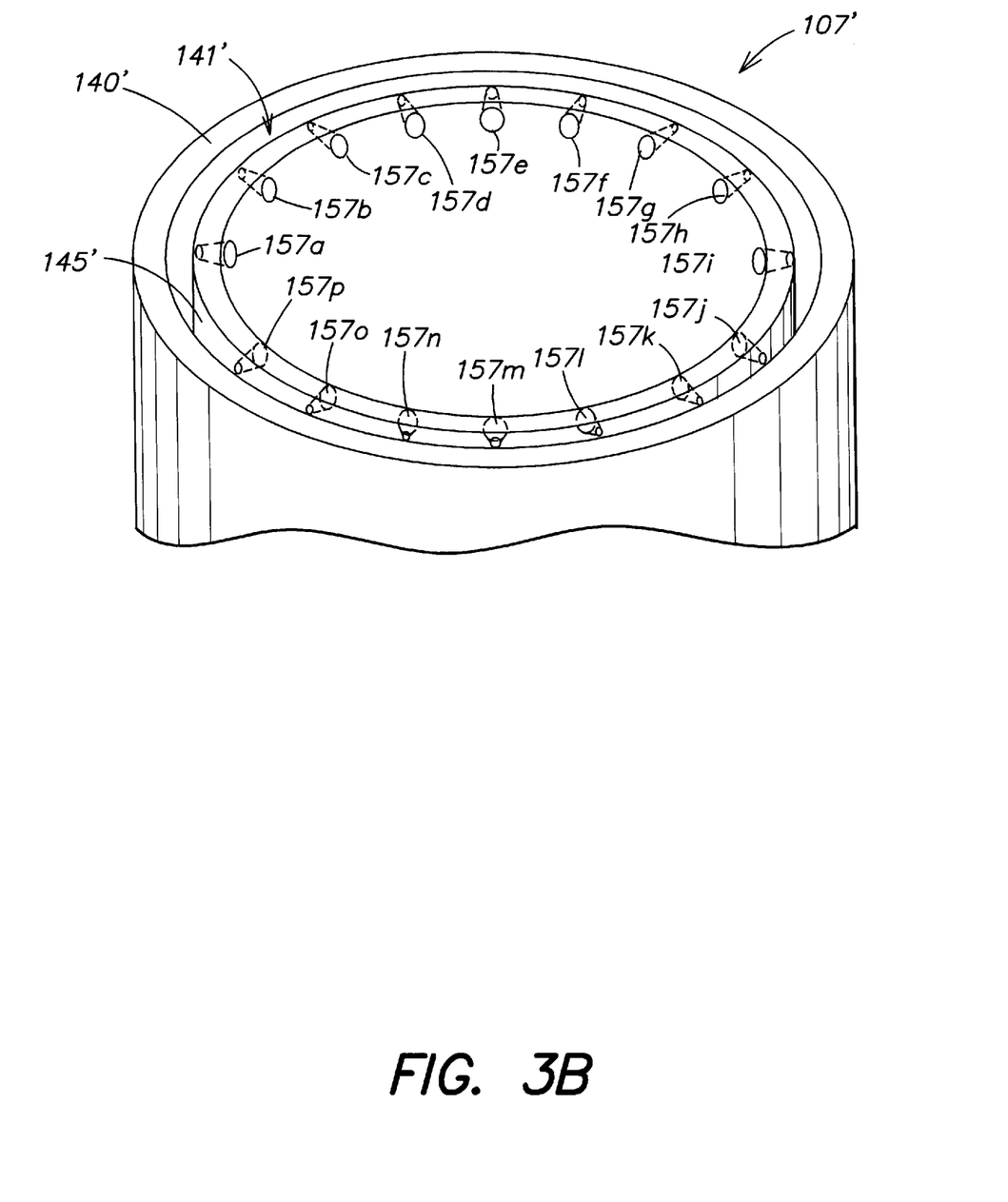
FIG. 3B is a bottom perspective view of the inventive target backing plate of FIG. 3A taken along line 3B—3B of FIG. 3A.

FIG. 3A is a partial side cross-sectional view of an inventive sputtering target assembly 103' configured in accordance with the present invention. As with the conventional sputtering target assembly 103 of FIG. 2A, the inventive sputtering target assembly 103' comprises a target backing plate 107' having a lipped perimeter 139'. However, the invention is equally applicable to non-lipped targets, as shown in and described with reference to FIGS. 4A–C. With reference to FIG. 3A, the lipped perimeter 139' comprises a sealing surface 140' having a dovetail groove 141' formed therein. The dovetail groove 141' is adapted to receive a sealing member, such as an o-ring 143'. Unlike the conventional target backing plate 107 of FIG. 2A, the groove 141' of the inventive target backing plate 107' has an inner wall 145' with a plurality of restrictive openings 157a–p formed therein (as shown in FIG. 3B which is a bottom perspective view of the target backing plate 107' taken along line 3B—3B of FIG. 3A). Preferably, the inner wall 145' of the groove 141' comprises sixteen equally spaced restrictive openings, although any other number may be employed and equal spacing need not be employed. The currently preferred shapes and dimensions of the restrictive openings are described below with reference to FIGS. 3C–4C. However, these shapes and dimensions are merely preferred. The invention may comprise any number of restrictive openings, the configurations of which may vary, so long as a pressure drop of 1–3 orders of magnitude occurs between the inner opening of the restrictive opening (i.e., the opening that faces the dovetail groove 141) and the outer opening of the restrictive opening (i.e., the opening that faces the processing region 113). Preferably the pressure of gas traveling through the outer opening 165 will be approximately equal to the pressure within the processing region 113 (most processes operate in the 1–10 mTorr range). Accordingly, the specific number and configuration of the restrictive openings are dependant on chamber pressure.

Figure 3C:
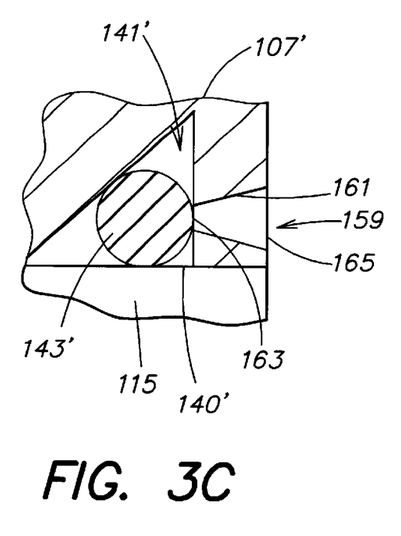
FIG. 3C is an enlarged side cross-sectional view of a first restrictive opening configuration for the target backing plate of FIG. 3A.
Figure 3D:
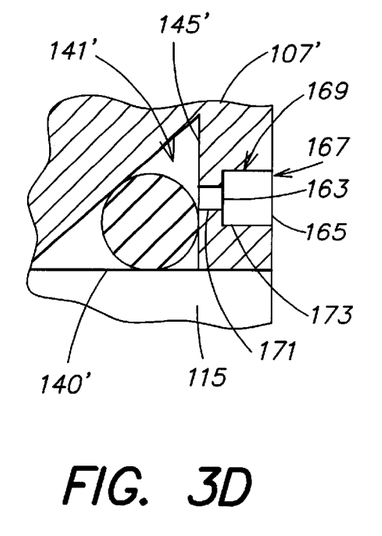
FIG. 3D is an enlarged side cross-sectional view of a second restrictive opening configuration for the target backing plate of FIG. 3A.
Figure 3E:
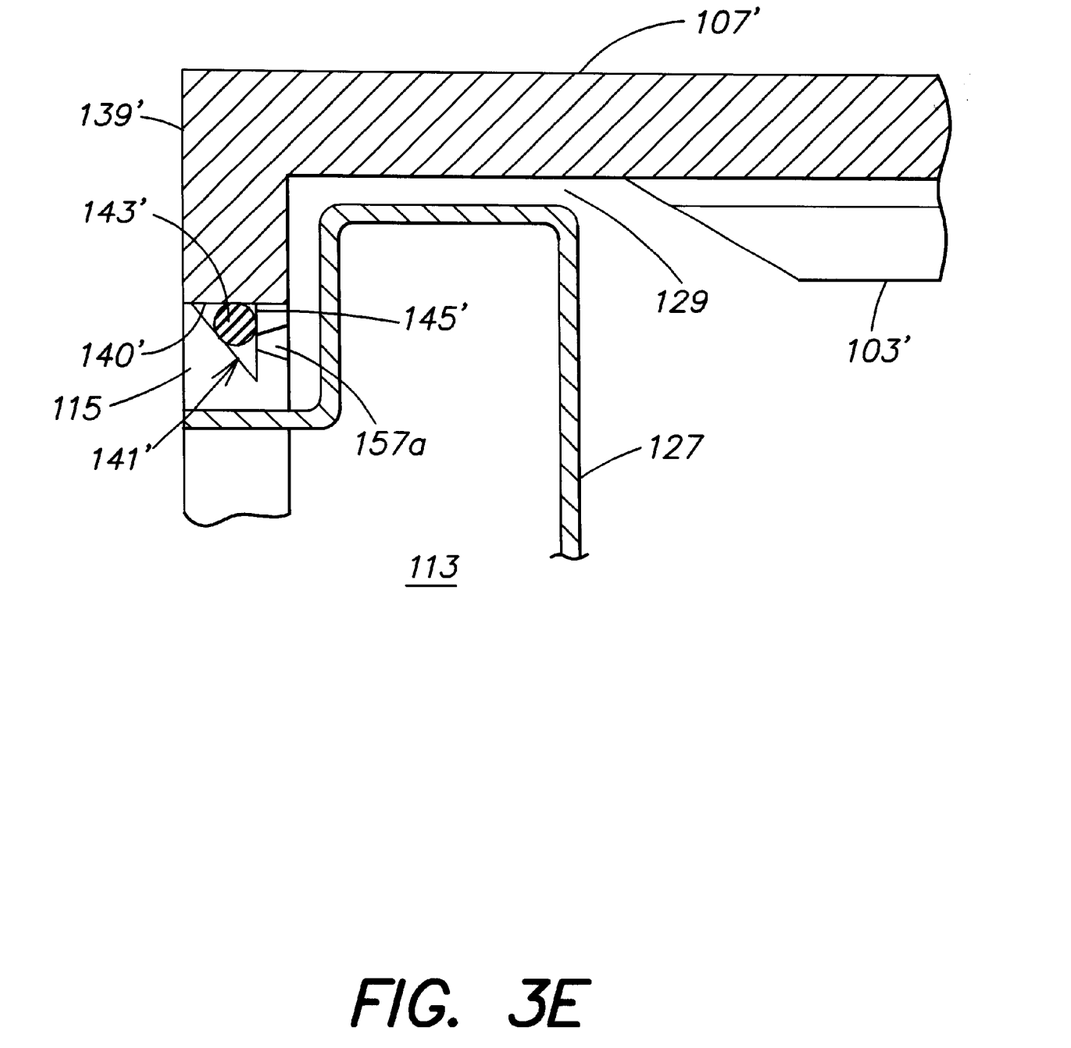
FIG. 3E is a partial side cross-sectional view of an inventive insulating member adapted to seal against a target backing plate of a sputtering target assembly.

FIGS. 3C and 3D are enlarged side cross-sectional views of a first and a second preferred configuration, respectively, for each restrictive opening 157a–p. With reference to FIG. 3C, a first restrictive opening configuration 159 is shown having continuously tapered sidewalls 161. The first restrictive opening 159 has an inner opening 163 that faces the dovetail groove 141 and an outer opening 165 that faces the processing region 113. The diameter of the inner opening 163 preferably is 1–2 mm and the diameter of the outer opening 165 preferably is 3–4 mm. The second restrictive opening configuration 167 of FIG. 3D is similarly configured, but has stepped sidewalls 169 having a first portion 171 with a diameter equal to that of the inner opening 163 and a second portion 173 with a diameter equal to that of the outer opening 165. The first portion 171 preferably has a length of 1–2 mm and the second portion 173 preferably has a length of 3–4 mm. It will be understood that other lengths for the first and second portions 171, 173, other diameters for the inner and outer openings 163, 165 and other shapes for the restrictive openings (e.g., oval, square, rectangular, triangular, etc.) may be employed. Further, each restrictive opening 157a–p may be uniquely sized and/or shaped. The dovetail groove 141' and the restrictive openings 157a–p alternatively may be formed within an insulating member 115' as shown in FIG. 3E.

Figure 4A:
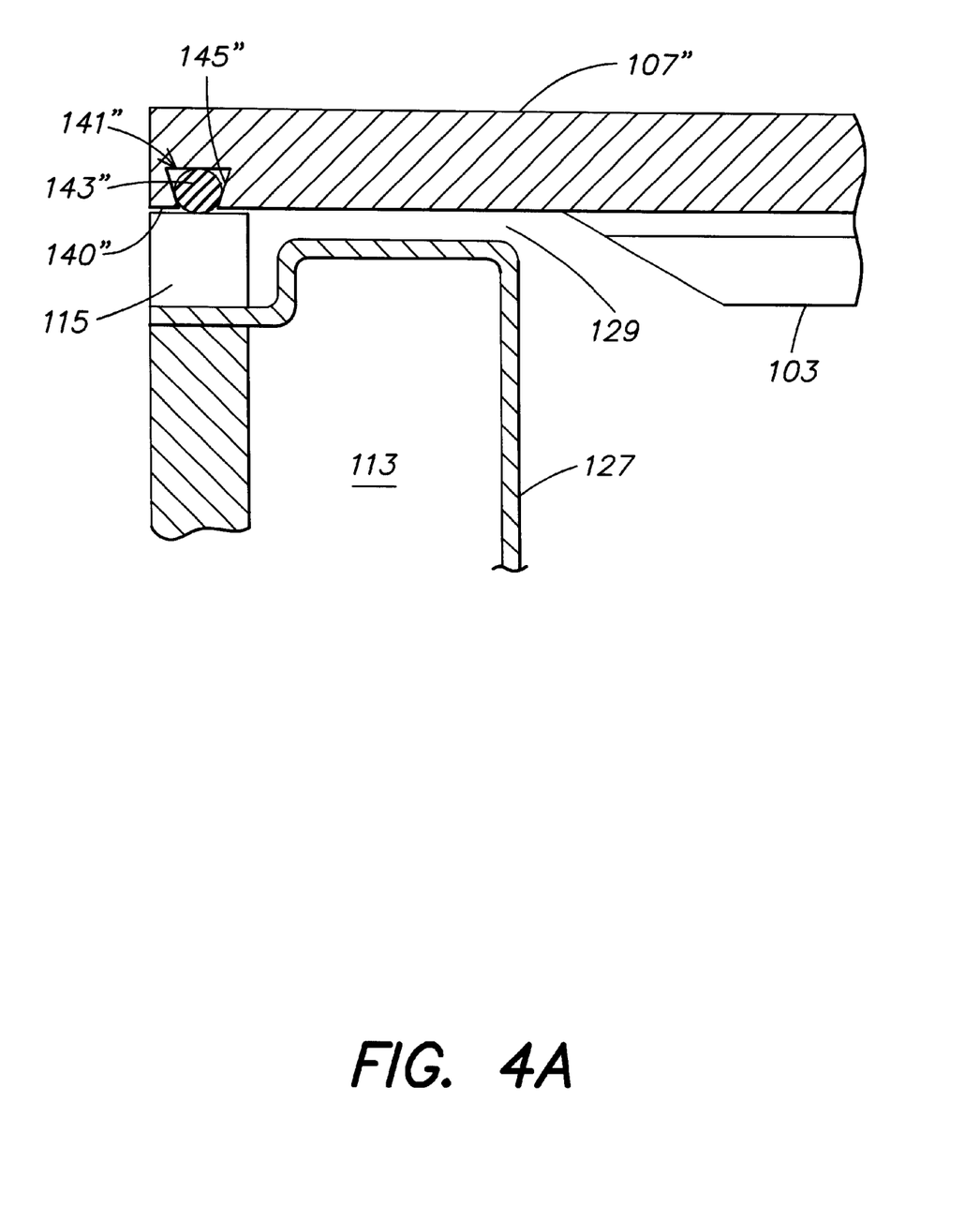
FIG. 4A is a partial side cross-sectional view of an inventive sputtering target assembly employing a non-lipped inventive target backing plate configured in accordance with the present invention.

FIG. 4A is a partial side cross-sectional view of an inventive sputtering target assembly 103" configured in accordance with the present invention. Unlike the inventive sputtering target assembly 103' of FIG. 3A, the inventive sputtering target assembly 103" of FIG. 4A comprises a target backing plate 107" that does not have a lipped perimeter. The perimeter of the target backing plate 107" comprises a sealing surface 140" having a dovetail groove 141" formed therein. The dovetail groove 141" is adapted to receive a sealing member, such as an o-ring 143". Like the inventive target backing plate 107' of FIG. 3A, the inventive target backing plate 107" of FIG. 4A has a plurality of restrictive openings (described with reference to FIGS. 4B and 4C) formed therein. Preferably, the inner wall 145" of the groove 141" comprises sixteen equally spaced restrictive openings, although any other number of openings may be employed and equal spacing is not necessary.

Figure 4B:
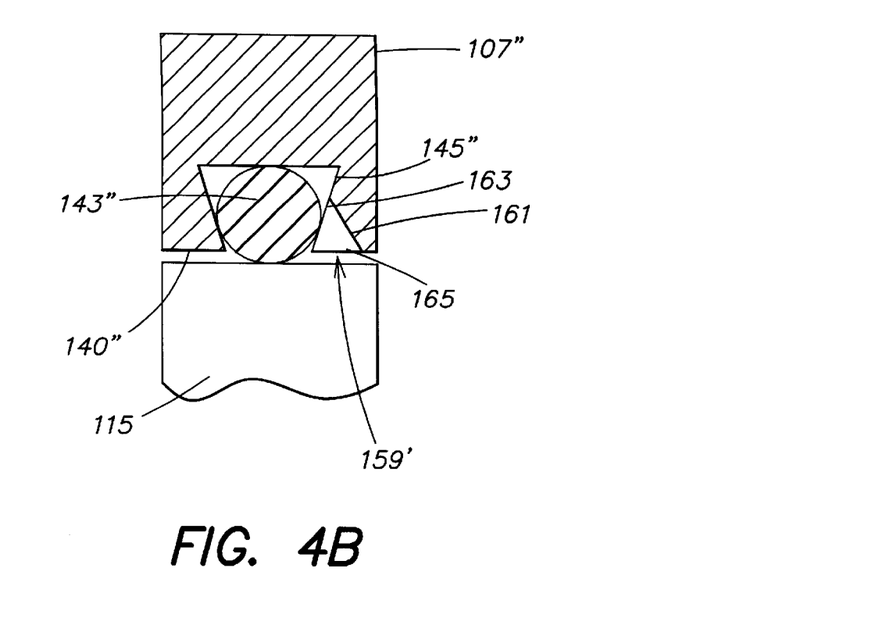
FIG. 4B is an enlarged side cross-sectional view of a first restrictive opening configuration for the target backing plate of FIG. 4A.
Figure 4C:
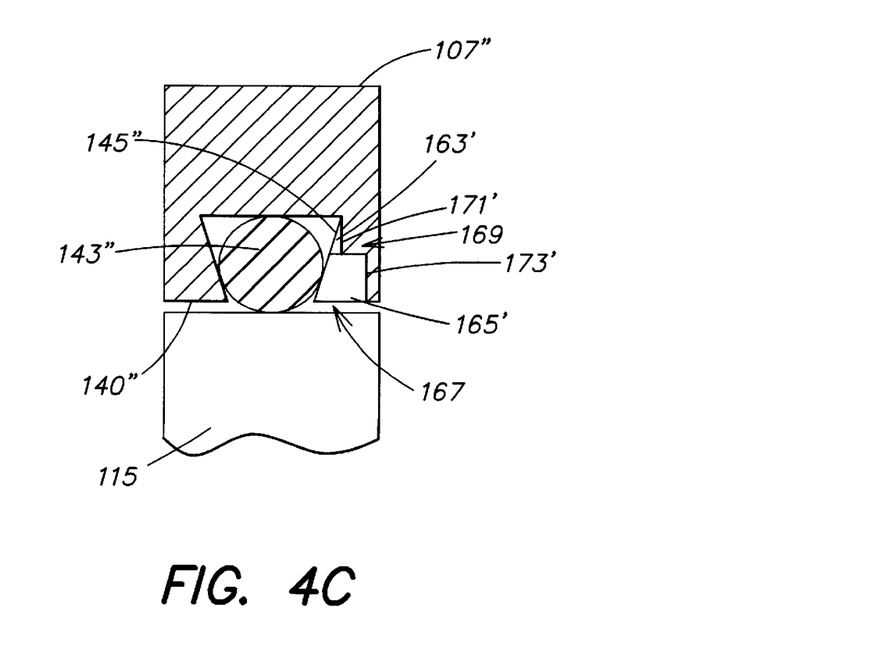
FIG. 4C is an enlarged side cross-sectional view of a second restrictive opening configuration for the target backing plate of FIG. 4A.

FIGS. 4B and 4C are enlarged side cross-sectional views of a first and a second preferred configuration, respectively, for each restrictive opening 157'a–p. With reference to FIG. 4B, a first restrictive opening configuration 159' is shown having continuously tapered sidewalls 161'. The first restrictive opening 159' has an inner opening 163' that faces the dovetail groove 141' and an outer opening 165' that faces the insulating member 115. The diameter of the inner opening 163' preferably is 1–2 mm and the diameter of the outer opening 165' preferably is 3–4 mm. The second restrictive opening configuration 167' of FIG. 4D is similarly configured, but has stepped sidewalls 169' having a first portion 171' with a diameter equal to that of the inner opening 163' and a second portion 173' with a diameter equal to that of the outer opening 165'. The first portion 171' preferably has a length of 1–2 mm and the second portion 173' preferably has a length of 3–4 mm. It will be understood that other lengths for the first and second portions 171', 173', other diameters for the inner and outer openings 163', 165' and other shapes for the restrictive openings (e.g., oval, square, rectangular, triangular, etc.) may be employed. Further, each restrictive opening 157'a–p may be uniquely sized and/or shaped. The dovetail groove 141" and the restrictive openings 157'a–p alternatively may be formed within insulating member 115 such as that previously shown in FIG. 3E.

The present inventors have found that increasing the number of openings for removing trapped gas from the o-ring 143, such as by providing more than four restrictive openings, decreases the concentration of trapped gas that is vented by each opening, decreases the partial pressure of trapped gas vented to the processing region 113, and thereby decreases the probability of arcing between the target surface 105a and the top boundary 153a of the plasma 153. Arc-induced defect formation thereby is reduced. Further, by providing each restrictive opening 157a–p or 157' a–p with an inner opening 163, 163' that is smaller than the outer opening 165, 165' (as is the case for any of the restrictive opening configurations 159, 159' or 167, 167'), the flow rate of trapped gas through each restrictive opening 157a–p, 157'a–p is significantly reduced. Due to the shape of the sidewalls of each restrictive opening 157a–p, 157'a–p (e.g., tapered or stepped from a small diameter nearest the groove 141', 141" to a large diameter nearest the processing region 113), trapped gas that enters the inner opening 163, 163' expands or disperses before exiting the outer opening 165, 165' and entering the processing region 113. Because the trapped gas is vented from the o-ring 143 at a slower rate and with a decreased concentration, the trapped gas may be pumped away before the gas reaches the dark space 155. Target arcing and defect generation associated therewith (e.g., splat formation) thereby are significantly decreased by employing the inventive target backing plate 107', 107" (or an inventive insulating member such as insulating member 115' of FIG. 3E).

In general any number of restrictive openings may be employed provided the number is sufficient to limit trapped gas flow rate to the processing region 113 to a level that reduces target arcing (e.g., at a rate that allows trapped gas to be pumped from the processing region 113 before the gas enters the dark space 155). The number of restrictive openings depends on the size and shape of each restrictive opening, as well as on target diameter.

The foregoing description discloses only the preferred embodiments of the invention, modifications of the above disclosed apparatus and method which fall within the scope of the invention will be readily apparent to those of ordinary skill in the art. For instance, the inventive target backing plate or insulating member described herein may be used for any suitable semiconductor manufacturing process (e.g., D.C. magnetron sputtering, high density plasma deposition, etc.). Further, although the inner and outer openings of the restrictive openings are described above in terms of their relative diameters, it will be understood that the openings need not be circular. Accordingly, the openings can also be described in terms of their relative areas. Finally, although dovetail grooves are preferred, other groove shapes may be employed.

Accordingly, while the present invention has been disclosed in connection with the preferred embodiments thereof, it should be understood that other embodiments may fall within the spirit and scope of the invention as defined by the following claims.

The invention claimed is:

1. A sealing surface of a sputter deposition chamber comprising:
   a groove adapted to receive a sealing member, the groove comprising an inner wall having a plurality of restrictive openings configured to restrict the flow of gas from the groove through the plurality of restrictive openings so as to reduce target arcing during a plasma process within the sputter deposition chamber.

2. The sealing surface of claim 1 wherein the plurality of restrictive openings comprise more than four restrictive openings.

3. The sealing surface of claim 1 wherein the plurality of restrictive openings comprise a sufficient number of restrictive openings to prevent target arcing due to the flow of gas from the groove through the plurality of restrictive openings.

4. The sealing surface of claim 1 wherein at least one of the plurality of restrictive openings comprises:
   an inner opening at a first end of the restrictive opening that faces the groove, the inner opening having an area associated therewith; and
   an outer opening at a second end of the restrictive opening and having an area greater than the area of the inner opening.

5. The sealing surface of claim 4 wherein the at least one of the plurality of restrictive openings comprises a tapered sidewall that extends from the inner opening to the outer opening of the at least one restrictive opening.

6. The sealing surface of claim 4 wherein the at least one of the plurality of restrictive openings comprises a stepped sidewall that extends from the inner opening to the outer opening of the at least one restrictive opening.

7. The sealing surface of claim 4 wherein the at least one of the plurality of restrictive openings has an inner opening diameter of about 1–2 mm and an outer opening diameter of about 3–4 mm.

8. The sealing surface of claim 1 wherein the sealing member comprises an o-ring.

9. The sealing surface of claim 1 wherein the plurality of restrictive openings are configured so as to result in a pressure drop of 1–3 orders of magnitude.

10. The sealing surface of claim 9 wherein at least one of the plurality of restrictive openings comprises:

an inner opening at a first end of the restrictive opening that faces the groove, the inner opening having an area associated therewith; and an outer opening at a second end of the restrictive opening and having an area greater than the area of the inner opening.

11. An insulating member adapted to insulate an enclosure wall of a sputter deposition chamber from a target backing plate, the insulating member comprising a sealing surface that includes:

a groove adapted to receive a sealing member, the groove comprising an inner wall having a plurality of restrictive openings configured to restrict the flow of gas from the groove through the plurality of restrictive openings so as to reduce target arcing during a plasma process within the sputter deposition chamber.

12. A target backing plate of a sputter deposition chamber, the target backing plate comprising a sealing surface that includes:

a groove adapted to receive a sealing member, the groove comprising an inner wall having a plurality of restrictive openings configured to restrict the flow of gas from the groove through the plurality of restrictive openings so as to reduce target arcing during a plasma process within the sputter deposition chamber.

13. A sputtering target assembly of a sputter deposition chamber, the sputtering target assembly comprising:

a target backing plate that includes a sealing surface, the sealing surface including a groove adapted to receive a sealing member, the groove comprising an inner wall having a plurality of restrictive openings configured to restrict the flow of gas from the groove through the plurality of restrictive openings so as to reduce target arcing during a plasma process within the sputter deposition chamber; and a sputtering target coupled to the target backing plate.

14. A sputter deposition chamber comprising:

a sputtering target assembly including a target backing plate that includes a sealing surface, the sealing surface including a groove adapted to receive a sealing member, the groove comprising an inner wall having a plurality of restrictive openings configured to restrict the flow of gas from the groove through the plurality of restrictive openings so as to reduce target arcing during a plasma process within the sputter deposition chamber, the sputtering target assembly further including a sputtering target coupled to the target backing plate; and an enclosure wall coupled to the target backing plate via at least one insulating member so as to form a vacuum chamber.

15. A method of reducing defect formation during plasma processing comprising:

providing a sputter deposition chamber having at least one sealing surface; and restricting the flow of gas from the at least one sealing surface into the sputter deposition chamber so as to reduce target arcing during sputter deposition within the sputter deposition chamber.

16. The method of claim 15 wherein restricting the flow of gas from the at least one sealing surface comprises providing an inner wall of a groove within the at least one sealing surface with a plurality of restrictive openings configured to restrict the flow of gas from the groove through the plurality of restrictive openings.

17. The method of claim 16 wherein providing an inner wall of a groove with a plurality of restrictive openings comprises providing an inner wall of a groove with more than four restrictive openings.

18. The method of claim 16 wherein providing an inner wall of a groove with a plurality of restrictive openings comprises providing an inner wall of a groove with a sufficient number of restrictive openings to reduce target arcing due to the flow of gas from the groove through the plurality of restrictive openings.

19. The method of claim 16 further comprising providing at least one of the plurality of restrictive openings with:

an inner opening at a first end of the restrictive opening that faces the groove, the inner opening having a diameter associated therewith; and an outer opening at a second end of the restrictive opening and having a diameter greater than the diameter of the inner opening.

20. The method of claim 19 further comprising providing the at least one of the plurality of restrictive openings with a tapered sidewall that extends from the inner opening to the outer opening of the at least one restrictive opening.

21. The method of claim 19 further comprising providing the at least one of the plurality of restrictive openings with a stepped sidewall that extends from the inner opening to the outer opening of the at least one restrictive opening.

22. The method of claim 19 further comprising providing the at least one of the plurality of restrictive openings with an inner opening diameter of about 1–2 mm and an outer opening diameter of about 3–4 mm.

23. The method of claim 15 wherein restricting the flow of gas from the at least one sealing surface into the sputter deposition chamber comprises flowing the gas through a restrictive opening that causes the gas to drop in pressure by 1–3 orders of magnitude as the gas flows from the at least one sealing surface into the sputter deposition chamber.

24. The method of claim 23 wherein flowing the gas through a restrictive opening causes the gas to drop in pressure to a pressure approximately equal to a pressure within the sputter deposition chamber.

* * * * *